US009536981B1

United States Patent
Cai et al.

(10) Patent No.: US 9,536,981 B1
(45) Date of Patent: *Jan. 3, 2017

(54) FIELD EFFECT TRANSISTOR DEVICE SPACERS

(71) Applicants: International Business Machines Corporation, Armonk, NY (US); GlobalFoundries, Inc., Grand Cayman (KY)

(72) Inventors: Xiuyu Cai, Niskayuna, NY (US); Sanjay C. Mehta, Niskayuna, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/868,414

(22) Filed: Sep. 29, 2015

(51) Int. Cl.
*H01L 29/66* (2006.01)
*H01L 21/8238* (2006.01)
*H01L 27/092* (2006.01)

(52) U.S. Cl.
CPC ... *H01L 29/6656* (2013.01); *H01L 21/823807* (2013.01); *H01L 21/823814* (2013.01); *H01L 21/823821* (2013.01); *H01L 27/0924* (2013.01); *H01L 29/66545* (2013.01)

(58) Field of Classification Search
None
See application file for complete search history.

(56) References Cited

U.S. PATENT DOCUMENTS

| 6,864,135 | B2 | 3/2005 | Grudowski et al. |
| 7,892,932 | B2 | 2/2011 | Cheng et al. |
| 8,278,166 | B2 | 10/2012 | Chen et al. |
| 8,466,034 | B2 * | 6/2013 | Maszara ........... H01L 29/66795 438/197 |
| 8,609,497 | B2 | 12/2013 | Chung et al. |
| 8,647,953 | B2 | 2/2014 | Liao et al. |
| 8,709,930 | B2 | 4/2014 | Tsai et al. |

(Continued)

OTHER PUBLICATIONS

V. S. Basker et al., "Method of Forming a Complementary Metal Oxide Semiconductor Structure With N-Type and P-Type Field Effect Transistors Having Symmetric Source/Drain Junctions and Optional Dual Silicides," U.S. Appl. No. 14/614,489, filed Feb. 5, 2015.

(Continued)

*Primary Examiner* — Evren Seven
(74) *Attorney, Agent, or Firm* — Cantor Colburn LLP; Vazken Alexanian

(57) ABSTRACT

A method for fabricating a field effect transistor device comprises forming a fin on a substrate, forming a first dummy gate stack and a second dummy gate stack over the fin, forming spacers adjacent to the fin, the first dummy gate stack, and the second dummy gate stack, etching to remove portions of the fin and form a first cavity partially defined by the spacers, depositing an insulator material in the first cavity, patterning a mask over the first dummy gate stack and portions of the fin, etching to remove exposed portions of the insulator material, and epitaxially growing a first semiconductor material on exposed portions of the fin.

19 Claims, 17 Drawing Sheets

(56) References Cited

U.S. PATENT DOCUMENTS

| | | | |
|---|---|---|---|
| 8,889,497 B2* | 11/2014 | Chen | H01L 29/7855 257/347 |
| 8,895,396 B1 | 11/2014 | Fu et al. | |
| 8,975,167 B2* | 3/2015 | Hong | H01L 29/78 257/192 |
| 9,064,890 B1* | 6/2015 | Xie | H01L 21/823431 |
| 9,093,478 B1* | 7/2015 | Cheng | H01L 29/6681 |
| 9,129,988 B1* | 9/2015 | Lee | H01L 29/66545 |
| 2005/0019993 A1* | 1/2005 | Lee | H01L 21/84 438/157 |
| 2011/0147842 A1* | 6/2011 | Cappellani | H01L 21/26506 257/365 |
| 2013/0178024 A1 | 7/2013 | Flachowsky et al. | |
| 2014/0027863 A1* | 1/2014 | Adam | H01L 29/16 257/410 |
| 2015/0035069 A1* | 2/2015 | Hung | H01L 27/1211 257/369 |
| 2015/0187943 A1* | 7/2015 | Lee | H01L 29/66636 257/192 |
| 2015/0228762 A1* | 8/2015 | He | H01L 29/66795 257/410 |
| 2015/0263045 A1* | 9/2015 | Leobandung | H01L 21/823431 257/351 |
| 2015/0270398 A1* | 9/2015 | Jacob | H01L 29/7849 257/401 |
| 2015/0364578 A1* | 12/2015 | Liu | H01L 29/66795 257/401 |
| 2016/0013291 A1* | 1/2016 | Jacob | H01L 29/6681 257/288 |

OTHER PUBLICATIONS

List of IBM Patents or Patent Applications Treated as Related; (Appendix P), Filed Jun. 29, 2016; 2 pages.

Xiuyu Cai, et al., "Field Effect Transistor Device Spacers", U.S. Appl. No. 15/085,112, filed Mar. 30, 2016.

Xiuyu Cai, et al., "Field Effect Transistor Device Spacers", U.S. Appl. No. 15/170,134, filed Sep. 29, 2015.

* cited by examiner

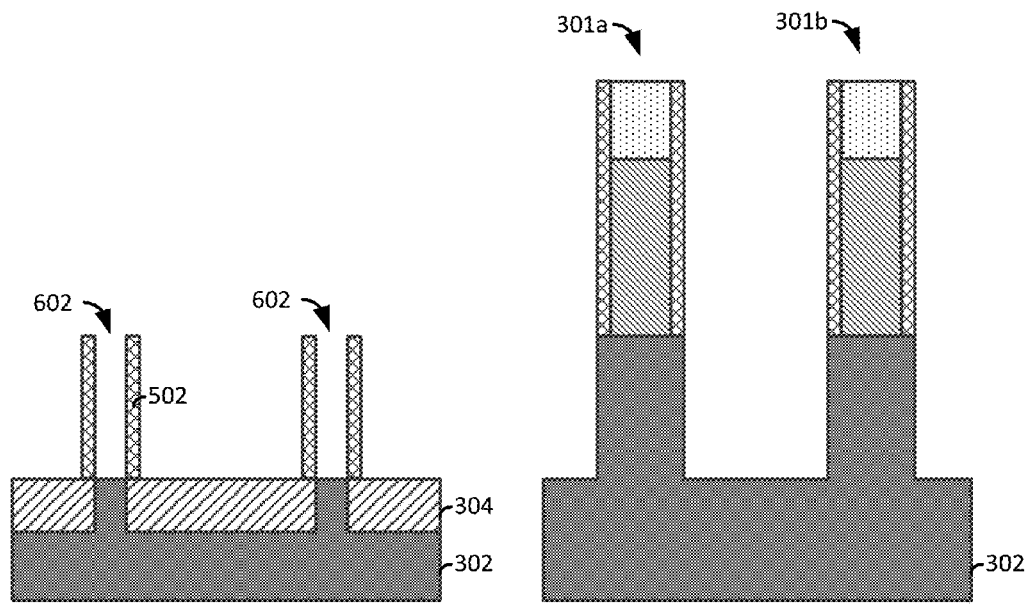
FIG. 6A
FIG. 6B
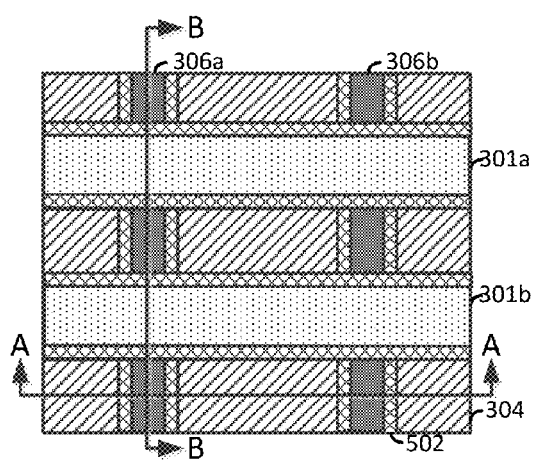
FIG. 6C

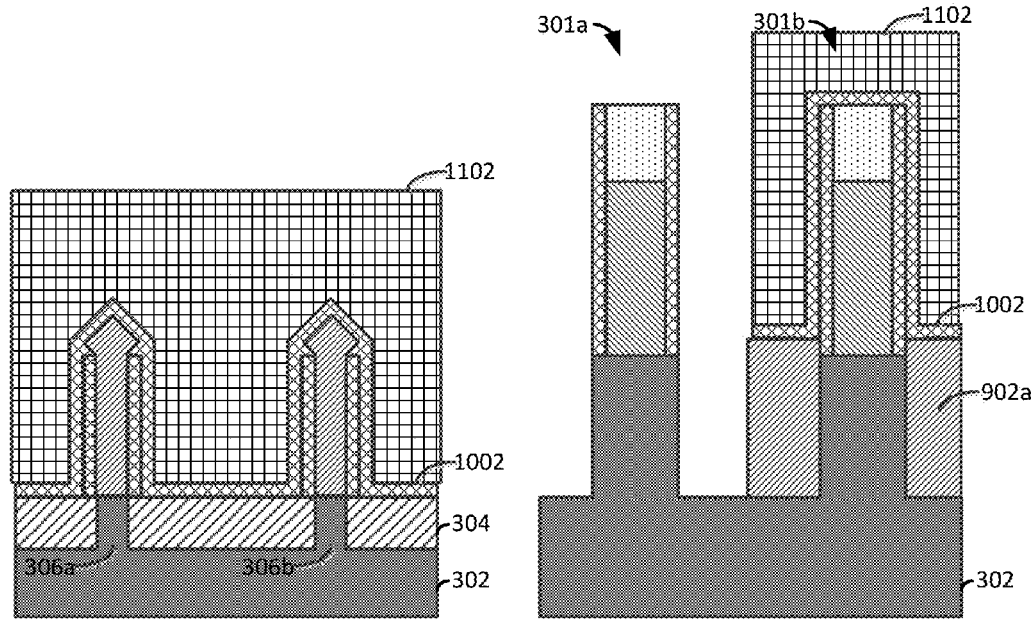
FIG. 13A
FIG. 13B
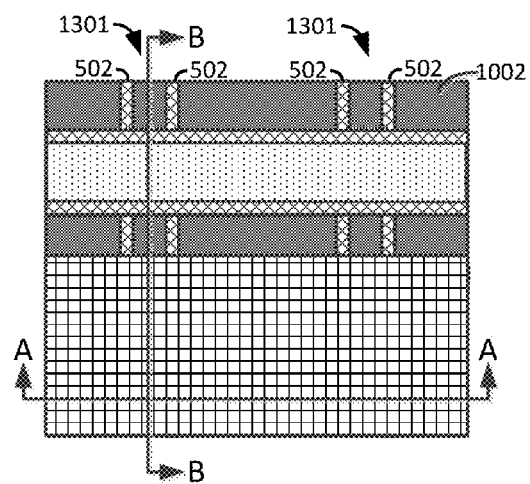
FIG. 13C

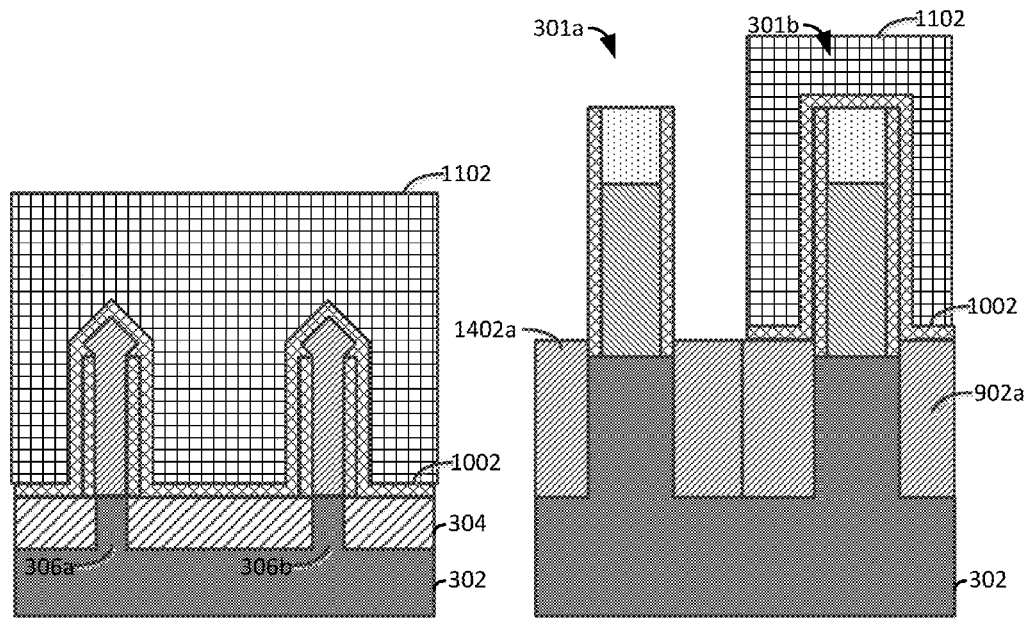
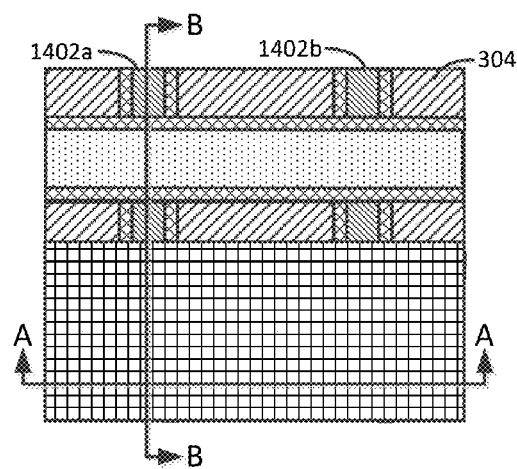
FIG. 14A  FIG. 14B
FIG. 14C

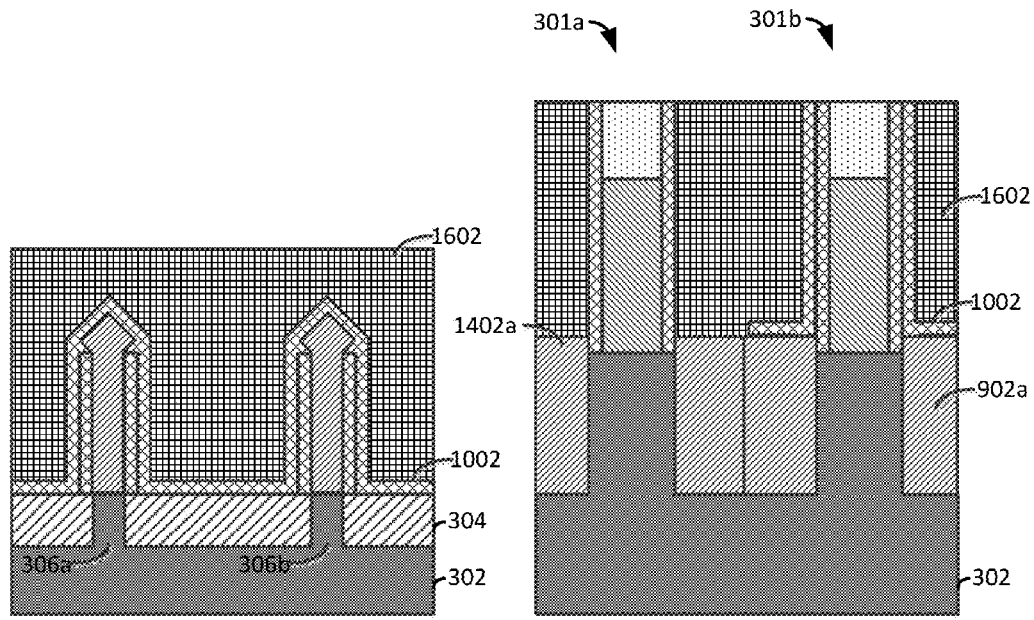
FIG. 16A
FIG. 16B
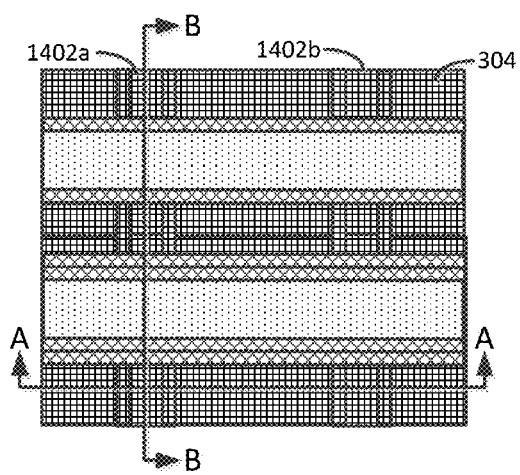
FIG. 16C

FIELD EFFECT TRANSISTOR DEVICE SPACERS

BACKGROUND

The present invention relates to field effect transistor (FET) devices, and more specifically, to forming spacers for FET devices.

FET devices such as planar FETs and multi-gate FETS such as finFETs often include spacers arranged adjacent to the gate stacks of the FET devices. The spacers facilitate alignment of the gate stacks and the active regions of the device.

Often when different types of FET devices, such as pFETs and nFETs are arranged on a common substrate, one of the types of FETs is formed by doping active regions of the device while the other type of FETs is protected by a masking layer. For example, a masking layer may be arranged over nFET devices while the active regions of the pFET devices are formed. Subsequently, the masking layer may be removed, and a second masking layer is arranged over the pFET devices, which allows the active regions of the nFET devices to be formed without damaging the pFET devices.

SUMMARY

According to an embodiment of the present invention, a method for fabricating a field effect transistor device comprises forming a fin on a substrate, forming a first dummy gate stack and a second dummy gate stack over the fin, forming spacers adjacent to the fin, the first dummy gate stack, and the second dummy gate stack, etching to remove portions of the fin and form a first cavity partially defined by the spacers, depositing an insulator material in the first cavity, patterning a mask over the first dummy gate stack and portions of the fin, etching to remove exposed portions of the insulator material, epitaxially growing a first semiconductor material on exposed portions of the fin, removing the mask, depositing a layer of insulator material on the fin, the first dummy gate stack and the second dummy gate stack, patterning a mask over the second dummy gate stack and portions of the fin, etching to remove exposed portions of the insulator material and the layer of insulator material to form a second cavity partially defined by the spacers, and epitaxially growing a second semiconductor material on exposed portions of the fin.

According to another embodiment of the present invention, a method for fabricating a field effect transistor device comprises forming a fin on a substrate, forming a first dummy gate stack and a second dummy gate stack over the fin, forming spacers adjacent to the fin, the first dummy gate stack, and the second dummy gate stack, etching to remove portions of the fin and form a first cavity partially defined by the spacers, depositing an insulator material in the first cavity, patterning a mask over the first dummy gate stack and portions of the fin, etching to remove exposed portions of the insulator material, and epitaxially growing a first semiconductor material on exposed portions of the fin.

According to yet another embodiment of the present invention, a field effect transistor device comprises a fin comprising a first portion having a first type of dopants, a first channel region, a second portion having a second type of dopants, and a second channel region, a first gate stack arranged on the first channel region, a second gate stack arranged on the second channel region, a first spacer arranged adjacent to the first gate stack, a second spacer arranged adjacent to the second gate stack, and the first spacer having a thickness substantially similar to a thickness of the second spacer such that a distance between the first portion of the fin and the first channel region is substantially similar to a distance between the first portion of the fin and the second channel region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 6A illustrates a cut away view along the line A-A of FIG. 6C following an etching process.

FIG. 6B illustrates a cut away view along the line B-B of FIG. 6C.

FIG. 6C illustrates a top view of FIGS. 6A and 6C.

FIG. 13A illustrates a cut away view along the line A-A of FIG. 13C following an etching process.

FIG. 13B illustrates a cut away view along the line B-B of FIG. 13C.

FIG. 13C illustrates a top view of FIGS. 13A and 13B.

FIG. 14A illustrates a cut away view along the line A-A of FIG. 14C of the formation of fins.

FIG. 14B illustrates a cut away view along the line B-B of FIG. 14C.

FIG. 14C illustrates a top view of FIGS. 14A and 14B.

FIG. 16A illustrates a cut away view along the line A-A of FIG. 16C following the deposition of an insulator layer.

FIG. 16B illustrates a cut away view along the line B-B of FIG. 16C.

FIG. 16C illustrates a top view of FIGS. 16A and 16B.

DETAILED DESCRIPTION

Figure 1:
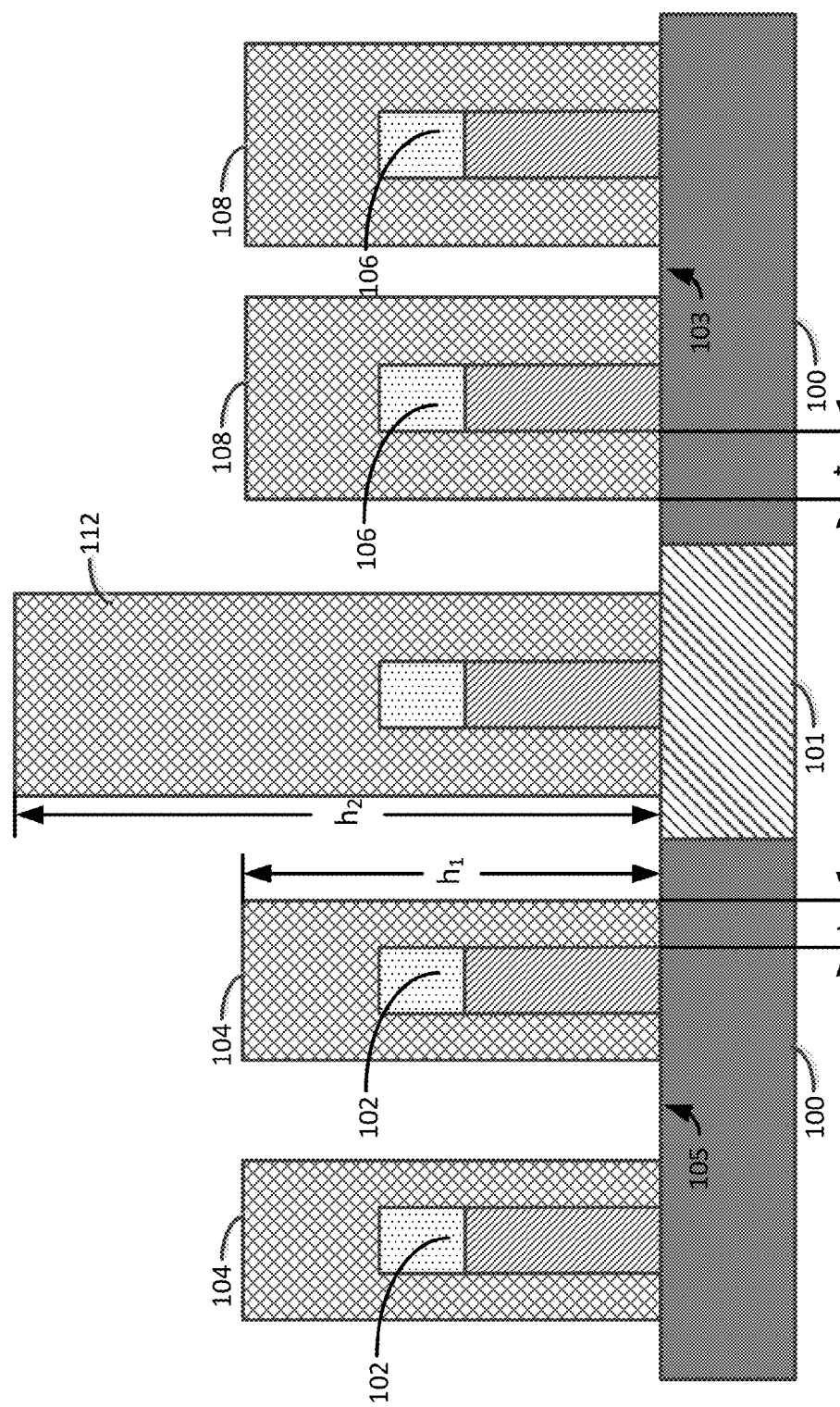
FIG. 1 illustrates a side view of an example of an arrangement of field effect transistor (FET) devices cut across the gate of a FET.

FIG. 1 illustrates a side view of an example of an arrangement of field effect transistor (FET) devices arranged on a substrate that includes active regions 100 and an insulator region 101. The active regions may include, for example a doped semiconductor material and the insulator region 101 may include an oxide material. The gate stacks 102 are gate stacks for a pFET device and the gate stacks 106 are gate stacks for an nFET device. Spacers 104 are arranged on the gate stacks 102 and spacers 108 are arranged on the gate stacks 106. The devices of FIG. 1 are fabricated using a mask to protect the pFET devices while the active regions for the nFET devices are formed. Following the formation of the active regions of the nFET devices, the mask is removed from the pFET devices and another mask is formed to protect the nFET devices. Once the second mask is formed, the active regions for the pFET devices may be formed.

One disadvantage to the method described above is that the masks have some overlapping portions in the insulator region 101, which results in a relatively tall formation of spacer material 112 in the insulator region 101, with respect to the spacer materials 104, 108 in the active regions. The formation of spacer material 112 has a height $h_2$ while the spacers 104, 108 in the adjacent FET devices have a height $h_1$ where $h_1$ is less than $h_2$. The formation of spacer material 112 may result in additional fabrication steps in subsequent fabrication processes.

Another disadvantage of the method described above is the differences in thicknesses of the spacers 104 and the spacers 108. In the illustrated example, the spacers 104 have a thickness $t_1$, while the spacers 108 have a thickness $t_2$ where $t_1$ is less than $t_2$. The thickness of the spacers affects the surface area of the active regions of the respective devices. Thus, the active region 103 between the spacers 108 is smaller than the active region 105 between the spacers 104. The relative differenced in the thickness of the spacers 104 and 108 may cause undesirable parasitic resistance due to differences in implant dosages in the active regions and differences in the extension regions between devices, which may lead to undesirably underlapped or overlapped devices.

Figure 2:
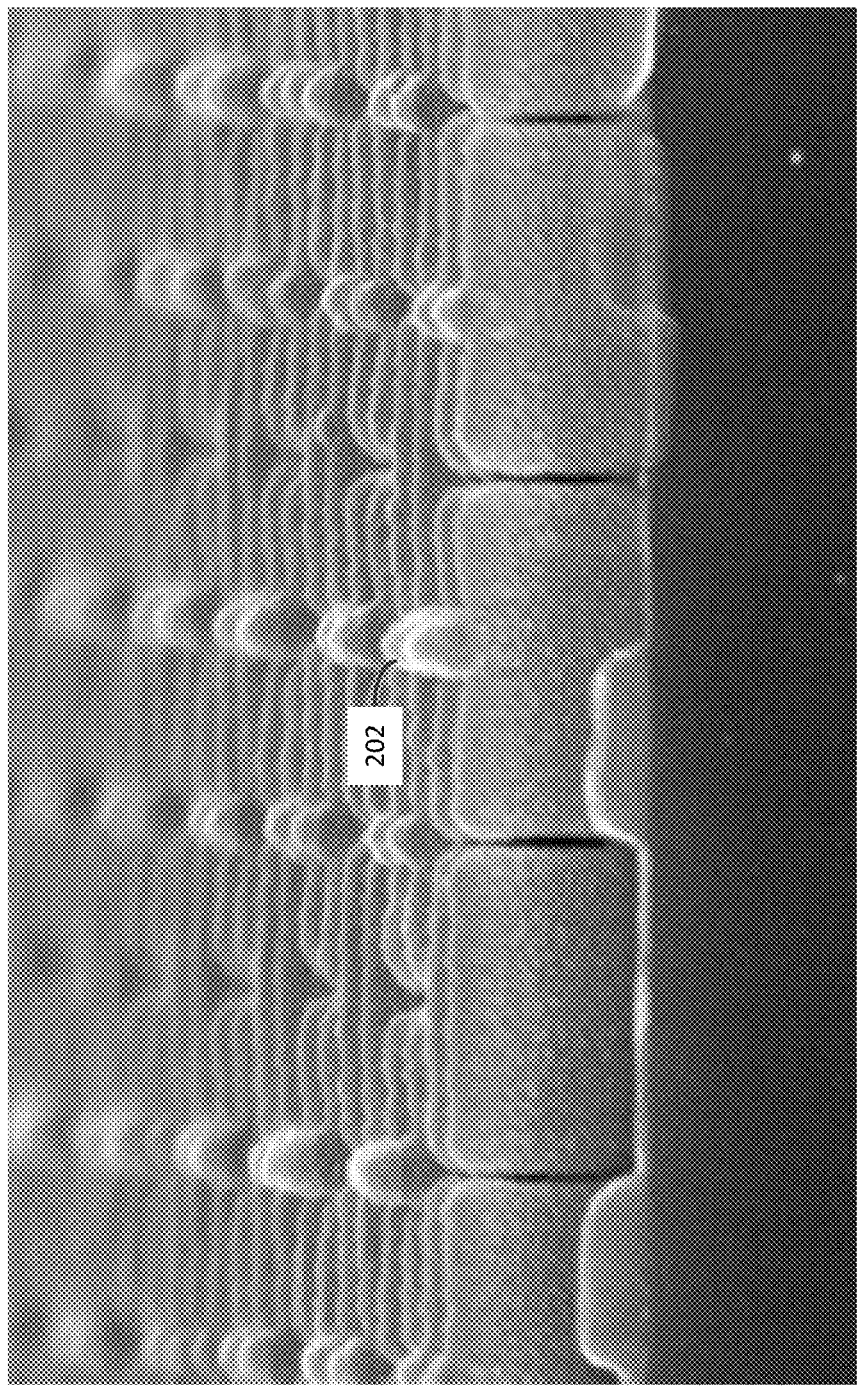
FIG. 2 illustrates a scanning electron microscopic image of an array of FET devices.

FIG. 2 illustrates a scanning electron microscopic image of an array of FET devices having undesirable relatively tall formations of spacer material 202 on insulator regions of the substrate.

The embodiments described below provide a method for forming FET devices having spacers with substantially similar thicknesses without forming a relatively tall formation of spacer material between FET devices.

Figure 3A:
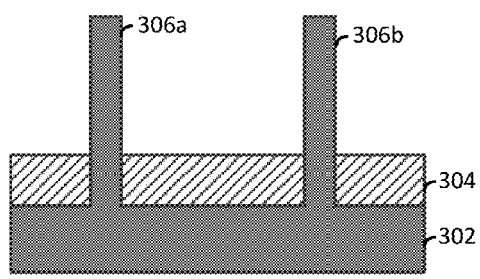
FIG. 3A illustrates a cut away view along the line A-A of FIG. 3C that includes a substrate and fins.
Figure 3B:
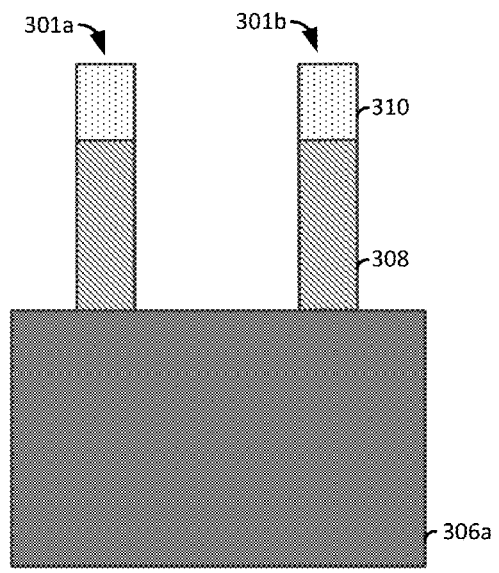
FIG. 3B illustrates a cut away view along the line B-B of FIG. 3C.
Figure 3C:
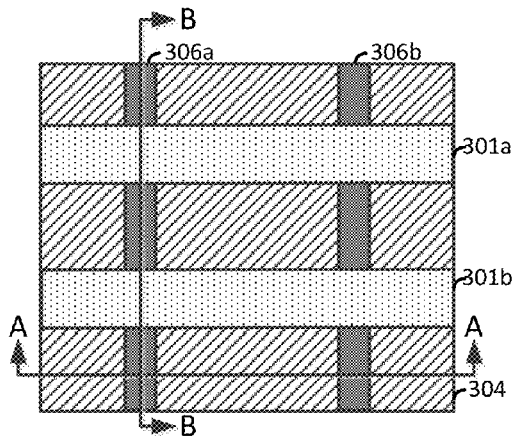
FIG. 3C illustrates a top view of the fins and the dummy gate stack.

FIG. 3A illustrates a cut away view along the line A-A of FIG. 3C, which includes a semiconductor substrate 302 that may include, for example, a semiconductor material such as silicon, or silicon germanium. An insulator layer 304 is arranged on the substrate 302. The insulator layer 304 may include, for example, an oxide or nitride material. Fins 306a and 306b that include a semiconductor material are arranged on the substrate 302. FIG. 3B illustrates a cut away view along the line B-B of FIG. 3C. Referring to FIG. 3B, dummy gate stacks 301a and 301b are arranged on the fins 306 and the insulator layer 304. The gate stacks 301a and 301b include, for example, a polysilicon layer 308 and a capping layer 310. FIG. 3C illustrates a top view of the fins 306 and the dummy gate stacks 301a and 301b. The dummy gates stacks 301a and 301b of the illustrated embodiment will, as described below, be used to align gate stacks for nFET and pFET devices. For example, in some embodiments, the dummy gate stack 301a will align a gate stack for a nFET device and the dummy gate stack 301b will align a gate stack for a pFET device, in an alternate exemplary embodiment the dummy gate stack 301a will align a gate stack for a pFET device and the dummy gate stack 301b will align a gate stack for an nFET device.

Figure 4A:
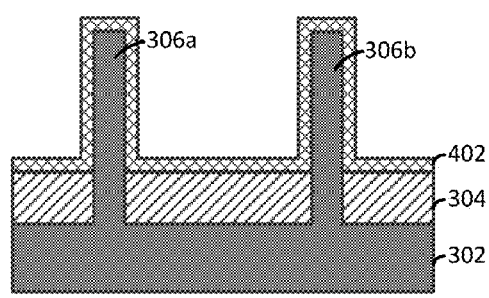
FIG. 4A illustrates a cut away view along the line A-A of FIG. 4C following the deposition of a layer of spacer material.
Figure 4B:
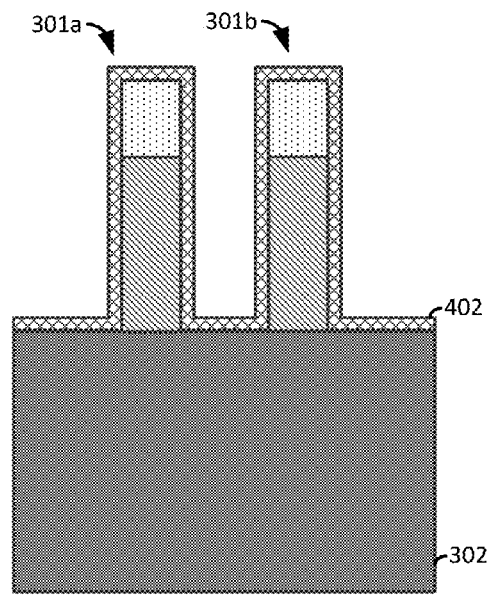
FIG. 4B illustrates a cut away view along the line B-B of FIG. 4C.
Figure 4C:
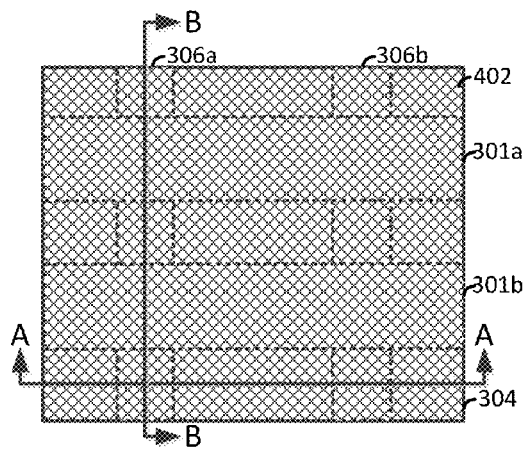
FIG. 4C illustrates a top view of FIGS. 4A and 4C.

FIG. 4A illustrates a cut away view along the line A-A of FIG. 4C, and FIG. 4B illustrates a cut away view along the line B-B of FIG. 4C. FIG. 4C illustrates a top view following the deposition of a layer of spacer material 402, which may include, for example, a nitride material such as, SiOCN, SiBCN, or SiN. The layer of spacer material 402 may be deposited using a deposition process such as, for example, Atomic Layer Deposition (ALD), LPCVD or pulsed CVD.

Figure 5A:
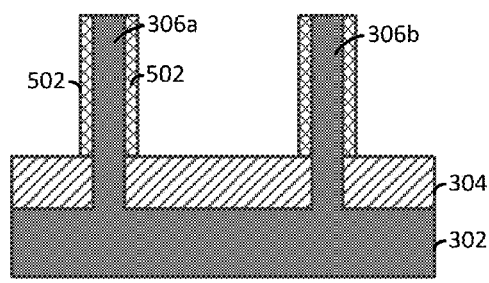
FIG. 5A illustrates a cut away view along the line A-A of FIG. 5C following the formation of spacers.
Figure 5B:
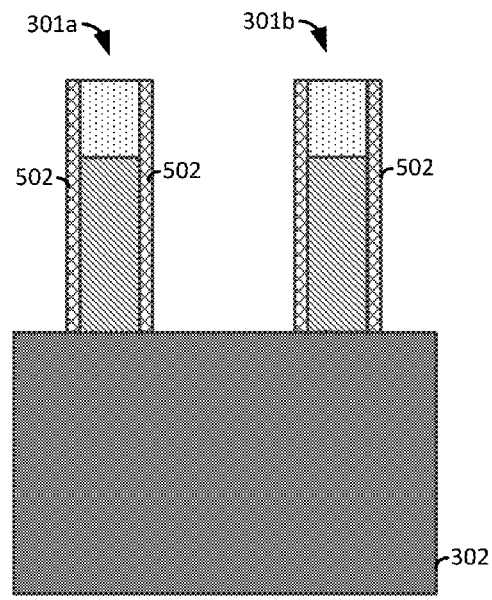
FIG. 5B illustrates a cut away view along the line B-B of FIG. 5C.
Figure 5C:
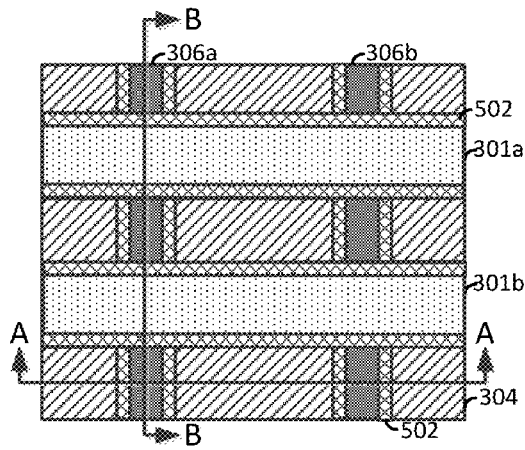
FIG. 5C illustrates a top view of FIGS. 5A and 5C.

FIG. 5A illustrates a cut away view along the line A-A of FIG. 5C, and FIG. 5B illustrates a cut away view along the line B-B of FIG. 5C. FIG. 5C illustrates a top view following the formation of spacers 502 along the substantially vertical sidewalls of the fins 306a and 306b and the dummy gate stacks 301a and 301b. The spacers 502 are formed by performing an anisotropic etching process such as, for example, reactive ion etching (RIE) that removes exposed portions of the layer of spacer material 402 (of FIG. 4A) to form the spacers 502.

FIG. 6A illustrates a cut away view along the line A-A of FIG. 6C, and FIG. 6B illustrates a cut away view along the line B-B of FIG. 6C. FIG. 6C illustrates a top view following an etching process that is selective to the insulator layer 304 and the spacers 502 to remove exposed portions of the fins 306a and 306b and form cavities 602 that are partially defined by the spacers 502 and the fins 306a and 306b.

Figure 7A:
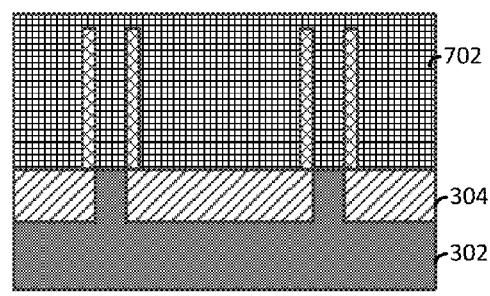
FIG. 7A illustrates a cut away view along the line A-A of FIG. 7C following the deposition of an insulator material layer
Figure 7B:
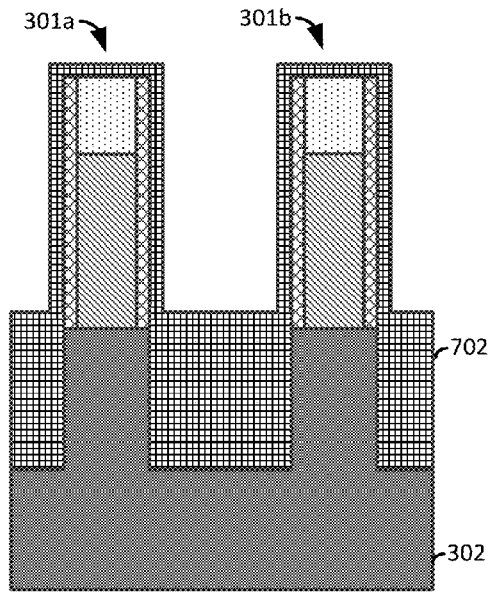
FIG. 7B illustrates a cut away view along the line B-B of FIG. 7C.
Figure 7C:
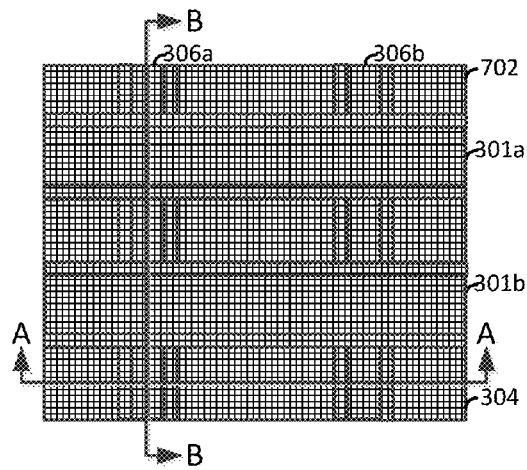
FIG. 7C illustrates a top view of FIGS. 7A and 7C.

FIG. 7A illustrates a cut away view along the line A-A of FIG. 7C, and FIG. 7B illustrates a cut away view along the line B-B of FIG. 7C. FIG. 7C illustrates a top view following the deposition of an insulator material layer 702 that fills the cavities 602 (of FIG. 6A) and covers portions of the spacers 502 and the dummy gate stacks 301a and 301b. The insulator material layer 702 may include, for example, an oxide, amorphous carbon or carbide material deposited using flowable CVD, ALD or spin coating, and etch selective with respect to the spacers 502 and Gate Hard Mask layer 301.

Figure 8A:
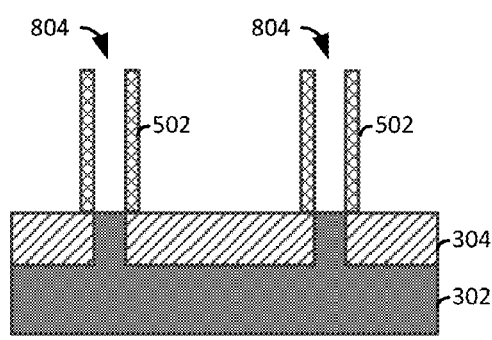
FIG. 8A illustrates a cut away view along the line A-A of FIG. 8C following the patterning and deposition of a mask.
Figure 8B:
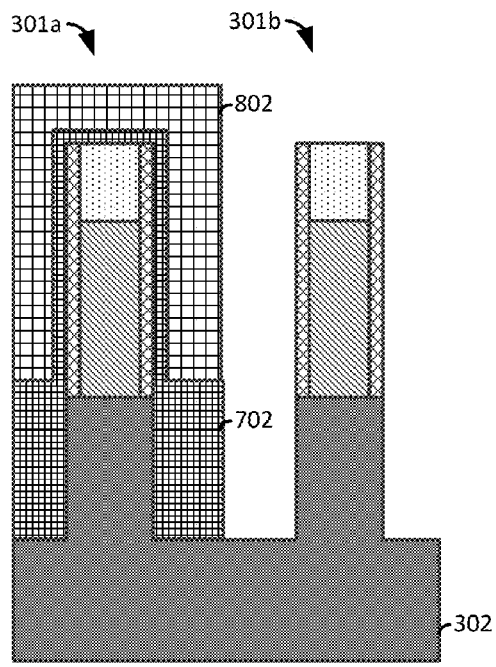
FIG. 8B illustrates a cut away view along the line B-B of FIG. 8C.
Figure 8C:
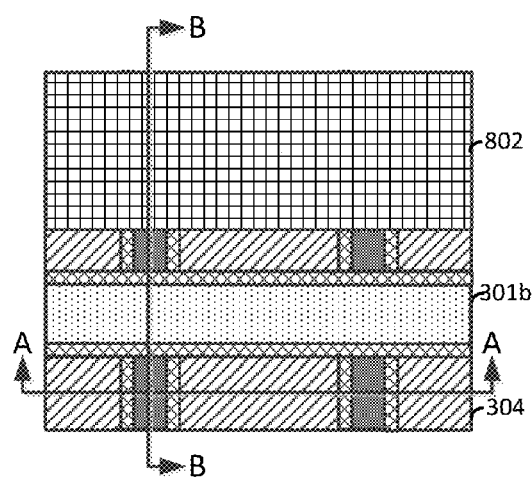
FIG. 8C illustrates a top view of FIGS. 8A and 8B.

FIG. 8A illustrates a cut away view along the line A-A of FIG. 8C, and FIG. 8B illustrates a cut away view along the line B-B of FIG. 8C. FIG. 8C illustrates a top view of the resultant structure following the patterning and deposition of a mask 802, which may include, for example an organic masking material that is patterned using a photolithographic process over the dummy gate stack 301a. Following the patterning of the mask 802, an etching process removes exposed portions of the insulator material layer 702 to expose cavities 804 that are partially defined by the spacers 502. The mask 802 protects the active regions of the dummy gate stack 301a during the etching process.

Figure 9A:
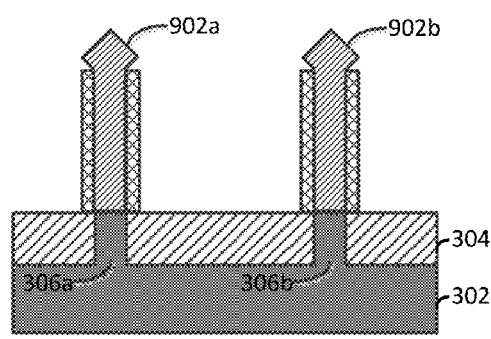
FIG. 9A illustrates a cut away view along the line A-A of FIG. 9C of the formation of fins.
Figure 9B:
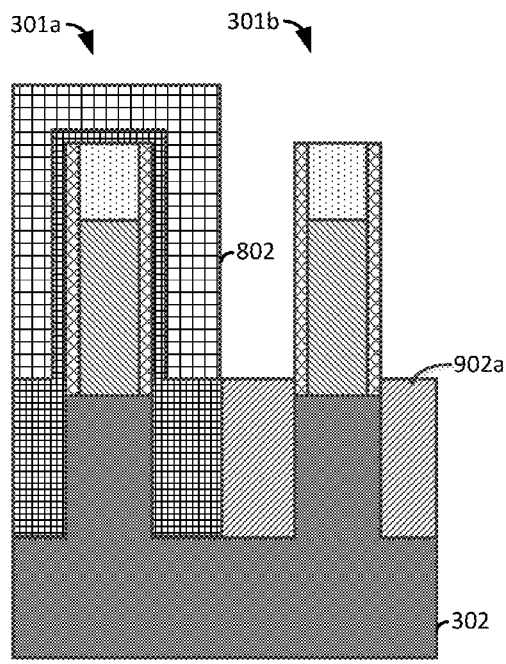
FIG. 9B illustrates a cut away view along the line B-B of FIG. 9C.
Figure 9C:
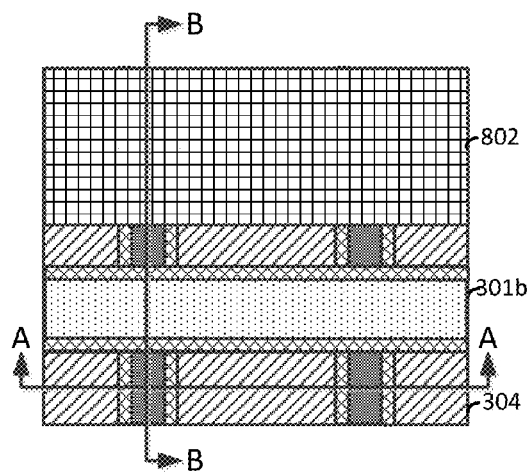
FIG. 9C illustrates a top view of FIGS. 9A and 9B.

FIG. 9A illustrates a cut away view along the line A-A of FIG. 9C, and FIG. 9B illustrates a cut away view along the line B-B of FIG. 9C. FIG. 9C illustrates a top view of the formation of fins 902a and 902b that include an epitaxially grown semiconductor material that is seeded by exposed portions of the fins 306a and 306b and confined laterally by the retained spacer sidewalls. The epitaxially grown semiconductor material may include, for example, a silicon or silicon germanium material. The fins 902a and 902b may be doped using an in-situ doping process during the epitaxial growth process, or may be doped using another suitable process such as, for example, ion implantation. In the illustrated embodiment, the epitaxially grown fins 902a and 902b are doped with p-type dopants, forming the source/drain regions of the pFET. Similarly, for the nFET source/drain regions, epitaxially grown fins may doped the fins 902a and 902b with n-type dopants.

Figure 10A:
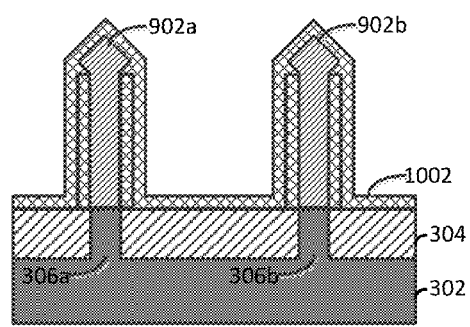
FIG. 10A illustrates a cut away view along the line A-A of FIG. 10C following the removal of the masking layer.
Figure 10B:
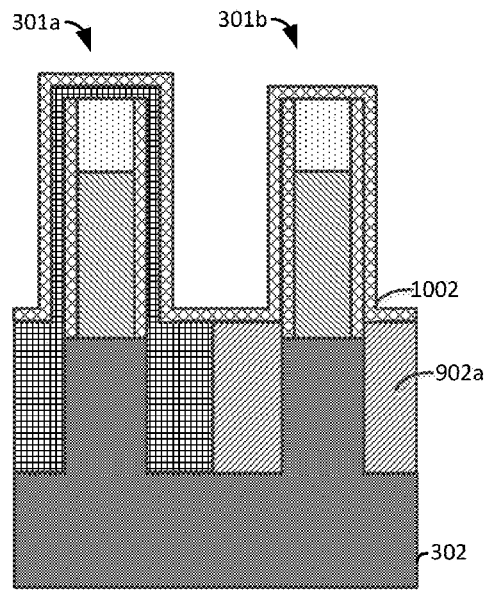
FIG. 10B illustrates a cut away view along the line B-B of FIG. 10C.
Figure 10C:
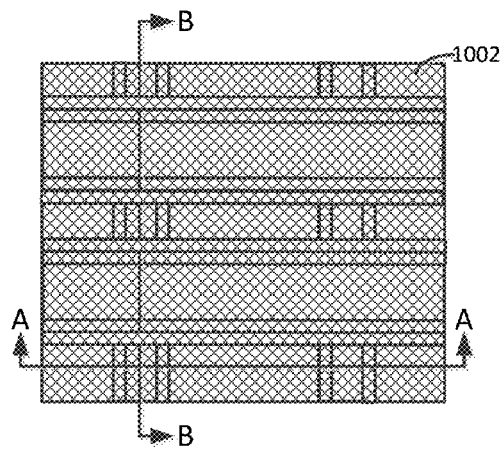
FIG. 10C illustrates a top view of FIGS. 10A and 10B.

FIG. 10A illustrates a cut away view along the line A-A of FIG. 10C, and FIG. 10B illustrates a cut away view along the line B-B of FIG. 10C. FIG. 10C illustrates a top view following the removal of the masking layer 802 (of FIG. 9A) and the formation of a layer of insulator material 1002 such as, for example, a nitride material over exposed portions of the fins 902a and 902b, the insulator layer 304, and the dummy gate stacks 301a and 301b. The insulator material 1002 may be formed by, for example, an ALD process. The insulator material 1002 is operative to protect the fins 902a and 902b.

Figures 11A, 11B:
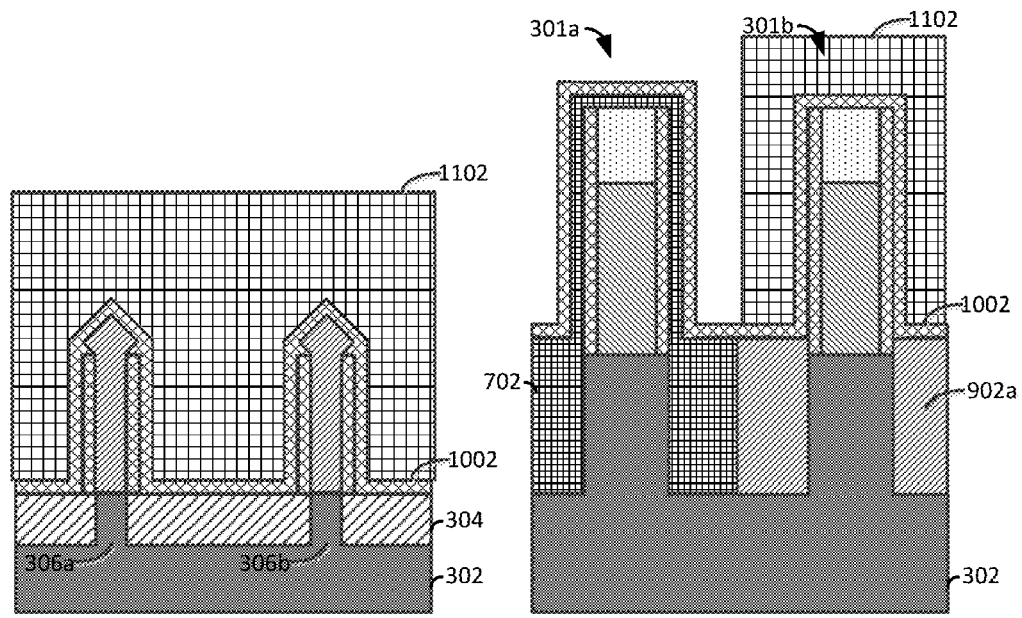
FIG. 11A illustrates a cut away view along the line A-A of FIG. 11C following the patterning and deposition of a mask.
FIG. 11B illustrates a cut away view along the line B-B of FIG. 11C.
Figure 11C:
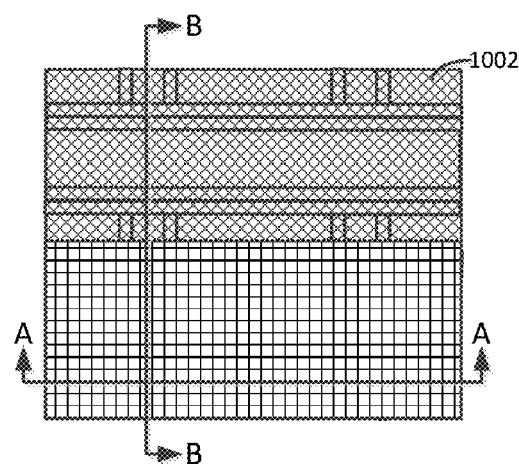
FIG. 11C illustrates a top view of FIGS. 11A and 11B.

FIG. 11A illustrates a cut away view along the line A-A of FIG. 11C, and FIG. 11B illustrates a cut away view along the line B-B of FIG. 11C. FIG. 11C illustrates a top view following the patterning and deposition of a mask 1102, which may include, for example an organic masking material that is patterned using a photolithographic process over the dummy gate stack 301b. In this regard, the mask 1102 protects the dummy gate stack 301b and the active regions of the device.

Figure 12A:
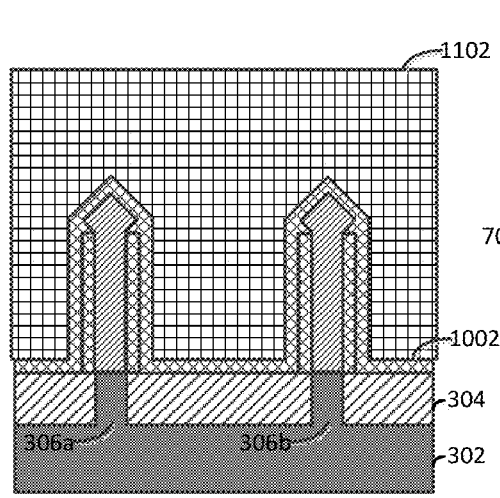
FIG. 12A illustrates a cut away view along the line A-A of FIG. 12C following an etching process.
Figure 12B:
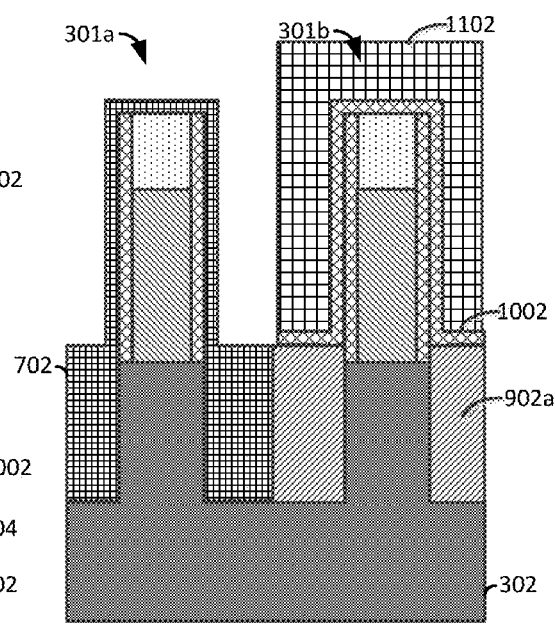
FIG. 12B illustrates a cut away view along the line B-B of FIG. 12C.
Figure 12C:
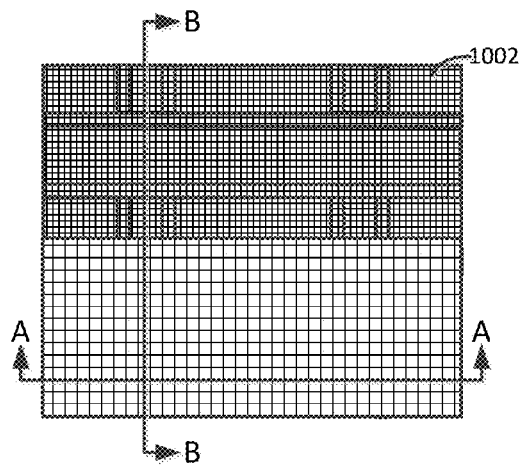
FIG. 12C illustrates a top view of FIGS. 12A and 12B.

FIG. 12A illustrates a cut away view along the line A-A of FIG. 12C, and FIG. 12B illustrates a cut away view along the line B-B of FIG. 12C. FIG. 12C illustrates a top view following an etching process that is selective to the insulator material layer 702 that removes exposed portions of the insulator material 1002 and exposes the insulator material layer 702.

FIG. 13A illustrates a cut away view along the line A-A of FIG. 13C, and FIG. 13B illustrates a cut away view along the line B-B of FIG. 13C. FIG. 13C illustrates a top view following an etching process such as, for example, a chemical wet etching process that removes exposed portions of the insulator material layer 702 of (FIG. 12A). After the exposed portions of the insulator material layer 702 are removed, an etching process such as, for example, reactive ion etching (RIE) is performed to remove exposed portions of the fins 306a and 306b to form cavities 1301 that are partially defined by the spacers 502.

FIG. 14A illustrates a cut away view along the line A-A of FIG. 14C, and FIG. 14B illustrates a cut away view along the line B-B of FIG. 14C. FIG. 14C illustrates a top view of the formation of fins 1402a and 1402b that include an epitaxially grown semiconductor material that is seeded by exposed portions of the fins 306a and 306b. The epitaxially grown semiconductor material may include, for example, a silicon or silicon germanium material. The fins 1402a and 1402b may be doped using an insitu doping process during the epitaxial growth process, or may be doped using another suitable process such as, for example, ion implantation. In the illustrated embodiment, the fins 1402a and 1402b are doped with n-type dopants, however alternate embodiments may dope the fins 1402a and 1402b with p-type dopants.

Figures 15A, 15B:
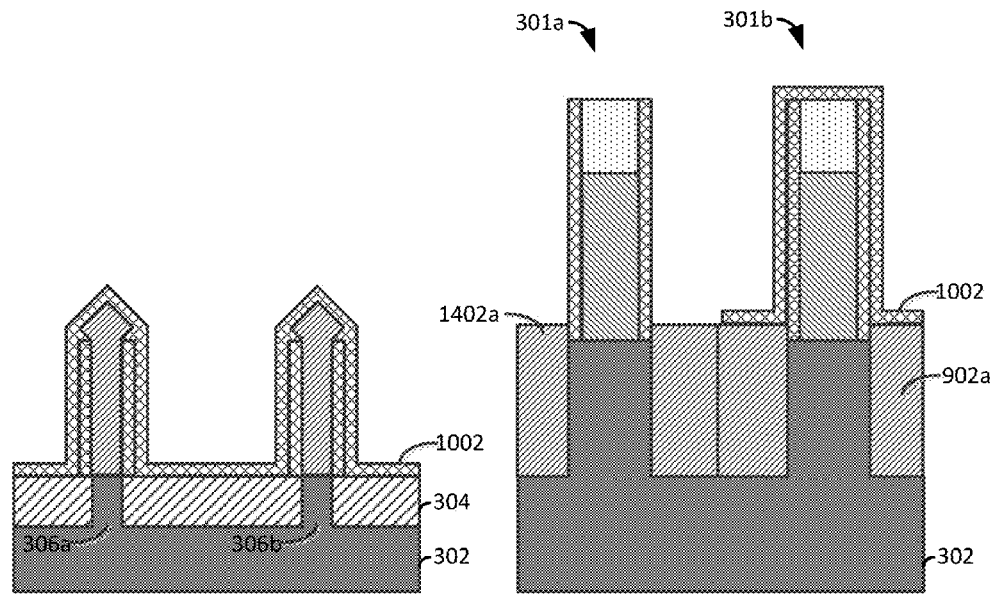
FIG. 15A illustrates a cut away view along the line A-A of FIG. 15C following the removal of the masking layer.
FIG. 15B illustrates a cut away view along the line B-B of FIG. 15C.
Figure 15C:
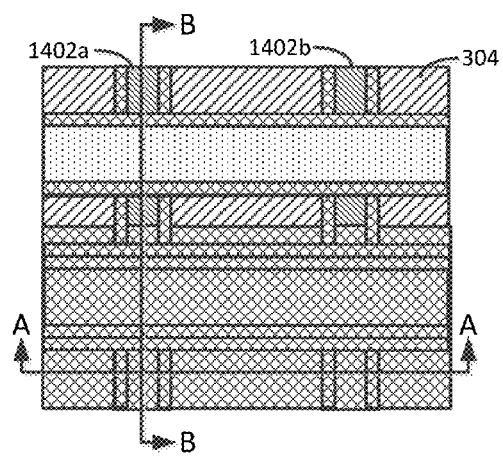
FIG. 15C illustrates a top view of FIGS. 15A and 15B.

FIG. 15A illustrates a cut away view along the line A-A of FIG. 15C, and FIG. 15B illustrates a cut away view along the line B-B of FIG. 15C. FIG. 15C illustrates a top view following the removal of the masking layer 1102 (of FIG. 14C).

FIG. 16A illustrates a cut away view along the line A-A of FIG. 16C, and FIG. 16B illustrates a cut away view along the line B-B of FIG. 16C. FIG. 16C illustrates a top view following the deposition of an insulator layer 1602 that may include, for example, an oxide material. After the insulator layer 1602 is deposited, a planarizing process such as, for example, chemical mechanical polishing (CMP) may be performed to expose the dummy gate stacks 301a and 301b. In the illustrated embodiment, the insulator material 1002 remains over the gate stack 301b. However, in alternate exemplary embodiments, the insulator material 1002 may be removed prior to depositing the insulator layer 1602.

Figures 17A, 17B:
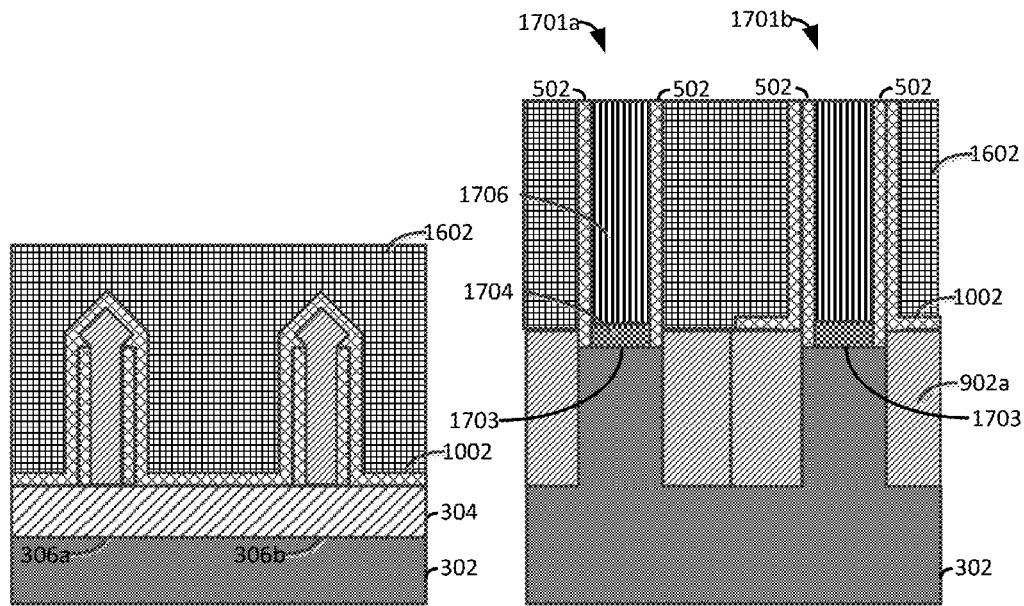
FIG. 17A illustrates a cut away view along the line A-A of FIG. 17C following the formation of gate stacks.
FIG. 17B illustrates a cut away view along the line B-B of FIG. 17C.
Figure 17C:
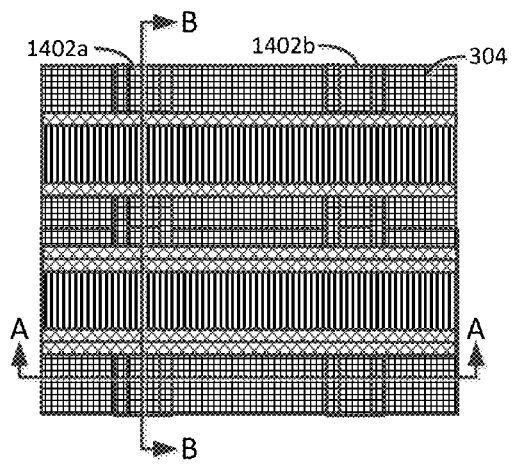
FIG. 17C illustrates a top view of FIGS. 17A and 17B.

FIG. 17A illustrates a cut away view along the line A-A of FIG. 17C, and FIG. 17B illustrates a cut away view along the line B-B of FIG. 17C. FIG. 17C illustrates a top view following the formation of gate stacks 1701a and 1702b. The gate stacks 1701a and 1701b are formed after the dummy gate stacks 301a and 301b (of FIG. 16C) are removed by a selective etching process. The gate stacks 1701a and 1701b of the present embodiment include a dielectric layer 1704 and a gate metal layer 1706 however; alternate embodiments may include gate stacks having any suitable combination of materials. Following the formation of the gate stacks 1701a and 1701b, conductive contacts (not shown) may be formed on the fins 1402a and 1402b.

Referring to FIG. 17B, the spacers 502 along the sidewalls of the gate stacks 1701a and 1701b have substantially similar thicknesses. The substantially similar thicknesses of the spacers 502 during the epitaxial growth of the fins 902a and 902b and the fins 1402a and 1402b results in active regions of the devices having a substantially similar offset from the channel regions 1703 of the device, which improves the performance of the devices. In the illustrated embodiment, two FET devices are shown however, alternate embodiments may include any number of FET devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a field effect transistor device, the method comprising:
    forming a fin on a substrate;
    forming a first dummy gate stack and a second dummy gate stack over the fin;
    forming spacers adjacent to the fin, the first dummy gate stack, and the second dummy gate stack;
    etching to remove portions of the fin and form a first cavity partially defined by the spacers;
    depositing an insulator material in the first cavity;
    patterning a mask over the first dummy gate stack and portions of the fin;
    etching to remove exposed portions of the insulator material;
    epitaxially growing a first semiconductor material on exposed portions of the fin;
    removing the mask;
    depositing a layer of insulator material on the fin, the first dummy gate stack and the second dummy gate stack;
    patterning a mask over the second dummy gate stack and portions of the fin;
    etching to remove exposed portions of the insulator material and the layer of insulator material to form a second cavity partially defined by the spacers; and
    epitaxially growing a second semiconductor material on exposed portions of the fin.

2. The method of claim 1, further comprising, removing the first dummy gate stack and removing the second dummy gate stack.

3. The method of claim 2, further comprising forming a first gate stack and a second gate stack over the fin.

4. The method of claim 1, wherein the first semiconductor material includes p-type dopants and the second semiconductor material includes n-type dopants.

5. The method of claim 1, wherein the first semiconductor material includes n-type dopants and the second semiconductor material includes p-type dopants.

6. The method of claim 1, wherein the fin includes a semiconductor material.

7. The method of claim 1, wherein the forming the spacers includes depositing a nitride material and performing an anisotropic etching process.

8. The method of claim 1, wherein epitaxially growing a first semiconductor material on exposed portions of the fin includes growing the first semiconductor material in the first cavity.

9. The method of claim 1, wherein epitaxially growing a second semiconductor material on exposed portions of the fin includes growing the second semiconductor material in the second cavity.

10. A method for fabricating a field effect transistor device, the method comprising:
    forming a fin on a substrate;
    forming a first dummy gate stack and a second dummy gate stack over the fin;
    forming spacers adjacent to the fin, the first dummy gate stack, and the second dummy gate stack;
    etching to remove portions of the fin and form a first cavity partially defined by the spacers;
    depositing an insulator material in the first cavity;
    patterning a mask over the first dummy gate stack and portions of the fin;
    etching to remove exposed portions of the insulator material; and
    epitaxially growing a first semiconductor material on exposed portions of the fin.

11. The method of claim 10, further comprising:
    removing the mask;
    depositing a layer of insulator material on the fin, the first dummy gate stack and the second dummy gate stack;
    patterning a mask over the second dummy gate stack and portions of the fin;
    etching to remove exposed portions of the insulator material and the layer of insulator material to form a second cavity partially defined by the spacers; and
    epitaxially growing a second semiconductor material on exposed portions of the fin.

12. The method of claim 11, further comprising, removing the first dummy gate stack and removing the second dummy gate stack.

13. The method of claim 12, further comprising forming a first gate stack and a second gate stack over the fin.

14. The method of claim 11, wherein the first semiconductor material includes p-type dopants and the second semiconductor material includes n-type dopants.

15. The method of claim 11, wherein the first semiconductor material includes n-type dopants and the second semiconductor material includes p-type dopants.

16. The method of claim 10, wherein the fin includes a semiconductor material.

17. The method of claim 10, wherein the forming the spacers includes depositing a nitride material and performing an anisotropic etching process.

18. The method of claim 10, wherein epitaxially growing a first semiconductor material on exposed portions of the fin includes growing the first semiconductor material in the first cavity.

19. The method of claim 11, wherein epitaxially growing a second semiconductor material on exposed portions of the fin includes growing the second semiconductor material in the second cavity.

\* \* \* \* \*